US 6,535,429 B2

(12) United States Patent
Conte et al.

(10) Patent No.: US 6,535,429 B2
(45) Date of Patent: Mar. 18, 2003

(54) READING CIRCUIT FOR A MEMORY CELL

(75) Inventors: Antonino Conte, Tremestieri Etneo (IT); Rosanna Maria La Rocca, S. Gregorio (IT); Giovanni Matranga, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/028,747

(22) Filed: Dec. 20, 2001

(65) Prior Publication Data

US 2002/0122333 A1 Sep. 5, 2002

(30) Foreign Application Priority Data

Dec. 20, 2000 (IT) .......................................... MI00A2763

(51) Int. Cl.$^7$ ............................................... G11C 16/06
(52) U.S. Cl. .................................. 365/185.21; 365/185.2
(58) Field of Search ......................... 365/185.18, 185.2, 365/185.21, 210

(56) References Cited

U.S. PATENT DOCUMENTS

| 5,218,570 A | * | 6/1993 | Pascucci et al. | ....... 365/185.21 |
|---|---|---|---|---|
| 5,267,202 A | * | 11/1993 | Dallabora et al. | ....... 365/185.2 |
| 5,886,925 A | * | 3/1999 | Campardo et al. | ..... 365/185.21 |
| 6,016,272 A | * | 1/2000 | Gerna et al. | ........... 365/185.21 |
| 6,330,188 B1 | * | 12/2001 | Pascucci | .................. 365/185.2 |
| 6,363,015 B1 | * | 3/2002 | Barcella et al. | ........ 365/185.21 |

* cited by examiner

*Primary Examiner*—Son Mai
(74) *Attorney, Agent, or Firm*—Lisa K. Jorgenson; Stephen Bongini; Fleit, Kain, Gibbons, Gutman & Bongini P.L.

(57) ABSTRACT

A reading circuit is provided for reading a memory cell. The reading circuit includes a reference current source, a memory cell biased between its first and second terminals at a predetermined voltage, comparison means for comparing a current flowing in the memory cell with the reference current, and a control gate voltage source coupled to a third terminal of the memory cell. The control gate voltage source includes a virgin memory cell that is biased between two terminals with a voltage of equal value to the biasing voltage of the memory cell. The control gate voltage source produces a control gate voltage at another terminal of the virgin memory cell. In one preferred embodiment, the memory cell and the virgin memory cell are EEPROM cells.

21 Claims, 5 Drawing Sheets

READING CIRCUIT FOR A MEMORY CELL

CROSS-REFERENCE TO RELATED APPLICATIONS

This application is based upon and claims priority from prior Italian Patent Application No. MI2000A002763, filed Dec. 20, 2000, the entire disclosure of which is herein incorporated by reference.

BACKGROUND OF THE INVENTION

1. Field of the Invention

The present invention relates to a reading circuit for a memory cell, particularly for the reading operation of an EEPROM memory cell.

2. Description of Related Art

To perform a reading operation of an EEPROM memory cell it is necessary to apply a suitable voltage to the control gate electrode so as to bias the cell at the desired values.

In applications such as a Smartcard realized in a technology having as a characteristic a channel length of the cells of 0.35 μm, the usual approach followed is to provide a control gate voltage biasing with a constant current to a virgin EEPROM cell.

This approach shows the advantage that the voltage in this way provided is strictly connected to the technological parameters of the EEPROM cells. Therefore the voltage will be of a suitable value also at the changing of the temperature and process parameters.

To perform the reading operation of the stored charge value in the memory cells a sense amplifier is used.

Another methodology used in EEPROM memories is to bias the diode connected virgin cell at a constant current value, as shown in FIG. 1, so as to make full use of its own threshold voltage value as a reference value.

This approach shows, however, the drawback of not reproducing on the virgin cell, taken as reference, the same biasing conditions used during the reading operation of the sense amplifier.

Moreover such biasing technique shows also the drawback that the generator circuit of the control gate voltage, shown in FIG. 1, not being provided with an output stage, has a very limited driving capability of the successive stages.

Due to the technological parameters of EEPROM memory cells, the output voltage provided by means of such a methodology is comprised between 2.5V and 3V, values that are higher than the lower supply voltage of the device.

Therefore there is the need to supply the circuit, adapted to provide the control gate voltage, at a higher voltage, called Vboost, with respect to the supply voltage Vcc, that in typical conditions is about Vboost=5.5V.

Moreover the control gate voltage is not provided by a single EEPROM memory cell but by means of a plurality of virgin cells so as to evaluate the possible changes of the process, that influence each memory cell.

This states that since for a single virgin memory cell the current is about ten microampere, thinking that a number "n" of virgin cells are used, the current that theoretically should provide the voltage Vboost is about a few tens of microampere.

In the case in which "n" is eight, the consumption can arrive at about a hundred microamperes.

This causes too high of a static consumption of the control gate voltage source.

SUMMARY OF THE INVENTION

In view of these drawbacks, it is an object of the present invention to overcome the above-mentioned drawbacks and to provide a control gate voltage which is stable with the working parameter changes of the reading system.

Another object of the present invention is to drive successive stages with a suitable control gate voltage.

Yet another object of the present invention is to minimize the current consumption of the Vboost circuit adapted to provide the control gate voltage.

According to a preferred embodiment of the present invention, a reading system of a memory cell includes source means of a reference current, a memory cell having a first, a second, and a third terminal, with the memory cell being biased between the first and second terminal at a predetermined voltage, comparison means for comparing a current flowing in the memory cell with the reference current, and a control gate voltage source applied to the third terminal of the memory cell, with the control gate voltage source including a virgin memory cell having a fourth, fifth, and sixth terminal, the virgin memory cell being biased between the fourth and fifth terminals with a voltage equal to the biasing voltage of the memory cell, and being of identical technological characteristics of the memory cell to be read, and the control gate voltage source producing a control gate voltage at the sixth terminal of the virgin memory cell.

The present invention provides a reading system of an EEPROM memory cell that is strictly connected with the technological parameters of the same EEPROM cells.

Moreover, the present invention reduces the power consumption of the control gate source.

Further, the present invention reduces the dimension of the Vboost source.

Also, the present invention provides the reference voltage in function of one or more EEPROM virgin cells.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
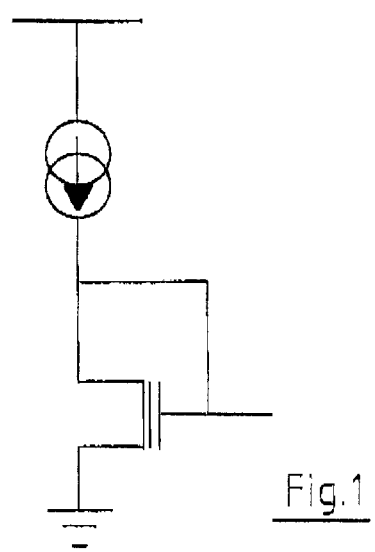
FIG. 1 shows a transdiode configuration of a conventional memory cell.

In FIG. 1, a basic scheme of a cell connected as a diode, adapted to describe a conventional control gate source, is shown.

Figure 2:
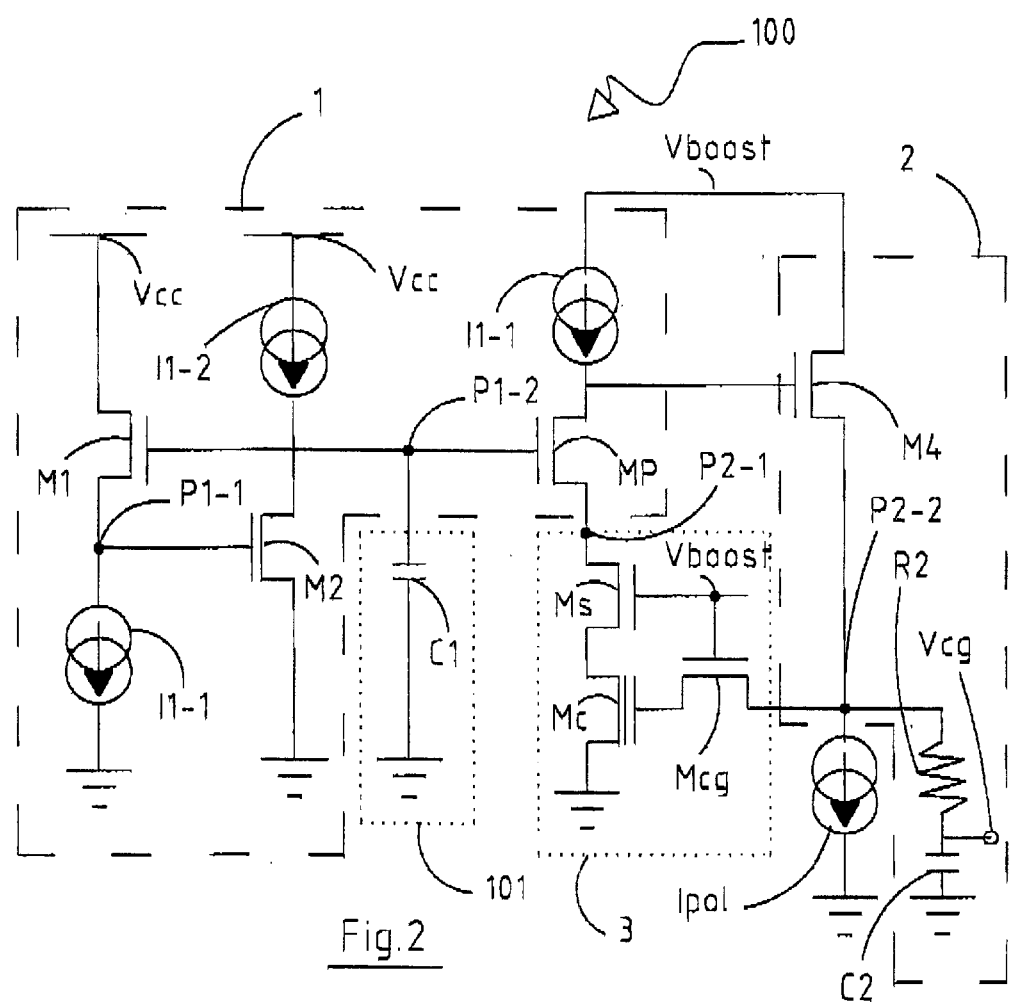
FIG. 2 shows a basic scheme of a voltage source according to a preferred embodiment of the present invention.

In FIG. 2, a control gate voltage source 100 according to a preferred embodiment of the present invention, implemented by macro EEPROM cells for Smartcard applications, is shown.

As shown, a block 1, there is provided a structure for providing a fixed voltage Vd (voltage of the drain terminal of the cell), a structure that emulates a sense amplifier, a block 2 showing a structure of an output stage, a block 3 showing a virgin cell, and a filtering block 101.

In the block 1 there is a transistor M1 connected directly to a supply line Vcc and connected to ground by means of a current source I1-1 of constant value, and a transistor M2 connected to the supply voltage Vcc by means of another current source I1-2 of constant value and connected directly to ground.

The block 101 comprises a capacitor C1 having an electrode connected to ground and the other connected to the gate terminal of the transistor M1 in a node P1-2.

The gate terminal of the transistor M1 and the drain terminal of the transistor M2 are both connected to the node P1-2.

The capacitor C1 has the function of filtering the noise coming from the supply lines Vcc.

The gate terminal of the second transistor M2 is connected to a node P1-1 that is the source terminal of the first transistor M1.

In the block 1 there is also a transistor MP connected to a voltage Vboost, with Vboost being higher than Vcc, by means of a source I1-1, and connected to ground by means of the block 3.

The block 2 comprises a transistor M4 connected directly to Vboost and connected to ground by means of a source Ipol of constant value. In parallel to the source Ipol, connected in a node P2-2, there is the series of a resistance R2 and a capacitor C2, the latter having an electrode connected to ground, from which a control gate voltage Vcg is taken.

The gate terminal of the transistor MP is connected to the node P1-2, and the gate terminal of M4 is connected to the drain terminal of the transistor MP.

The virgin cell represented by the block 3 is assembled by the whole of a transistor Ms, adapted to represent the selection transistor of the cell to be activated, by a transistor Mc, adapted to represent the virgin cell as such, and by a transistor Mcg.

The transistor Ms has its gate terminal connected to Vboost, being connected at a side to the transistor MP and at the other side to Mc and the gate terminal connected with Mcg.

The transistor Mc is connected directly to ground with its own source terminal, and the transistor Mcg is connected in the common node P2-2 with the source Ipol and with the series R2-C2.

The operation of the source Ipol and of the series R2-C2 will be described hereinafter with reference to FIG. 5.

In the path containing the transistor M1, the current by which it is possible to polarize the virgin cell Mc is settled, by means of the source I1-1.

Since the current on M2 is settled by the source I1-2, its gate terminal, node P1-1, is arranged at a suitable value of voltage of about 800 mV.

This states that the voltage on the node P1-2 is equal to 800 mV plus the value of the threshold voltage of the transistor M1. The node P1-2 has the function of driving the transistor MP, that is technologically equal and with the same dimensions as the transistor M1 and it is also biased by the same current value of the transistor M1.

In this way the drain electrode of Ms, node P1-2, reaches a voltage of about 800 mV. The voltage Vd is therefore equal to 800 mV.

The voltage on the transistor Mcg, that is on the gate terminal of the virgin cell, will reach a suitable value established by the couple of parameters that are the current of the source I1-1 and the voltage present on the drain terminal, that is Vd=800 mV.

The voltage Vcg at the output terminal of the series R2-C2 is therefore the result of the biasing conditions forced on the cell Mc.

Figure 3:
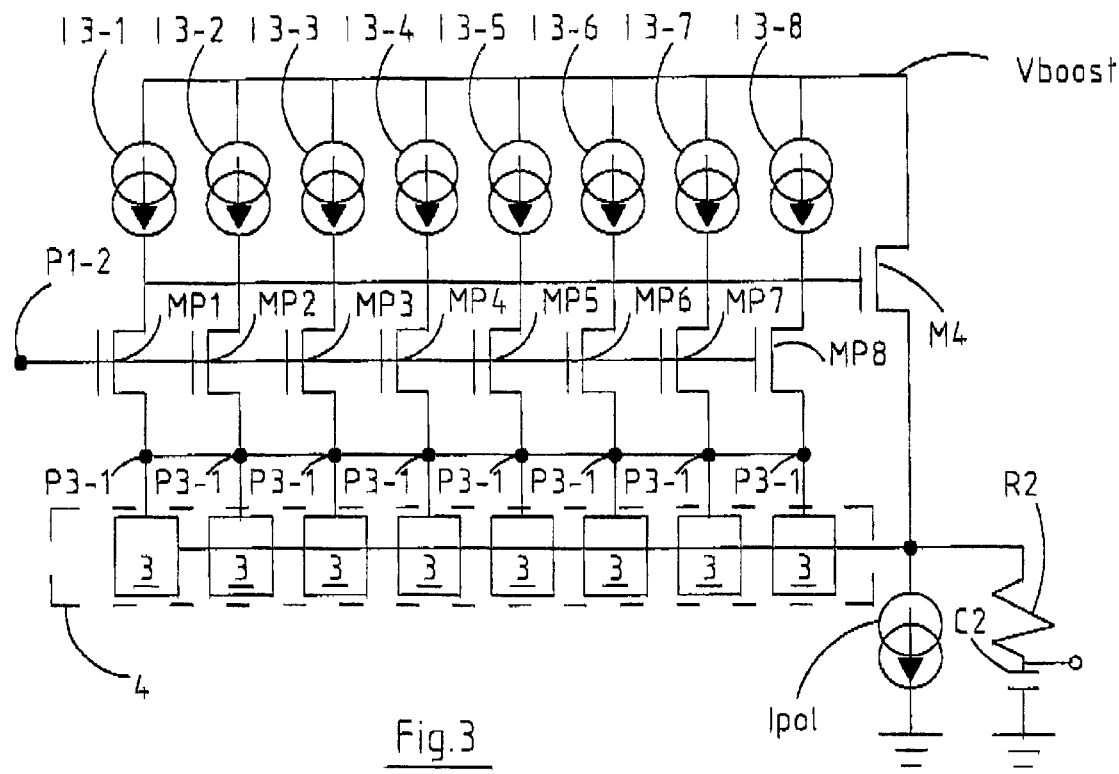
FIG. 3 shows a biasing circuit of a matrix according to one embodiment of the present invention.

To take into account the spreads of the technological characteristics of the cells, rather than a single virgin cell Mc, is to be used a matrix, by way of example, constituted by two rows each containing four cells, as described in FIG. 3.

FIG. 3 is a further embodiment of the present invention and it is a repetition of the path containing the biasing transistor MP.

As shown, it is possible to note that the structure comprises a plurality of sources I3-1, . . . , I3-8, and a plurality of transistors MP1, . . . , MP8 and a block 4, comprising a plurality of blocks 3, the latter described heretofore with reference to FIG. 2.

The sources I3-1, . . . , I3-8 are equal to the source I1-1 and the transistors MP1, . . . , MP8 are equal to the transistor MP, that is the structure of FIG. 2 is repeated so many times as the virgin cells are contained in the block 4.

In the exemplary embodiment shown, eight virgin cells MC1, . . . , MC8 are connected in the node P3-1 to the biasing transistors MP1, . . . , MP8, in their turn biased by eight respective biasing sources I3-1, . . . , I3-8 connected to the voltage Vboost, so as the forced currents by the sources I3-1, . . . , I3-8 are equal to the current forced by I1-1.

It is to be noted that the node P3-1 corresponds to node P2-1 of FIG. 2.

It is also to be noted that the gate terminals of the eight transistors are connected to the node P1-2 that is the connecting node with the block 1 shown in FIG. 2 so as to ensure that the drain electrodes of the eight virgin cells are all biased to an equal voltage, that is Vd=800 mV.

Such a structure, that is the source of control gate voltage 100 and the matrix of cells 4, has a remarkable static power consumption, because the current must be provided so many times as the virgin cells MC1, . . . , MC8 are and it is provided by the supply line Vboost, that is higher than the supply line Vcc.

Figure 4:
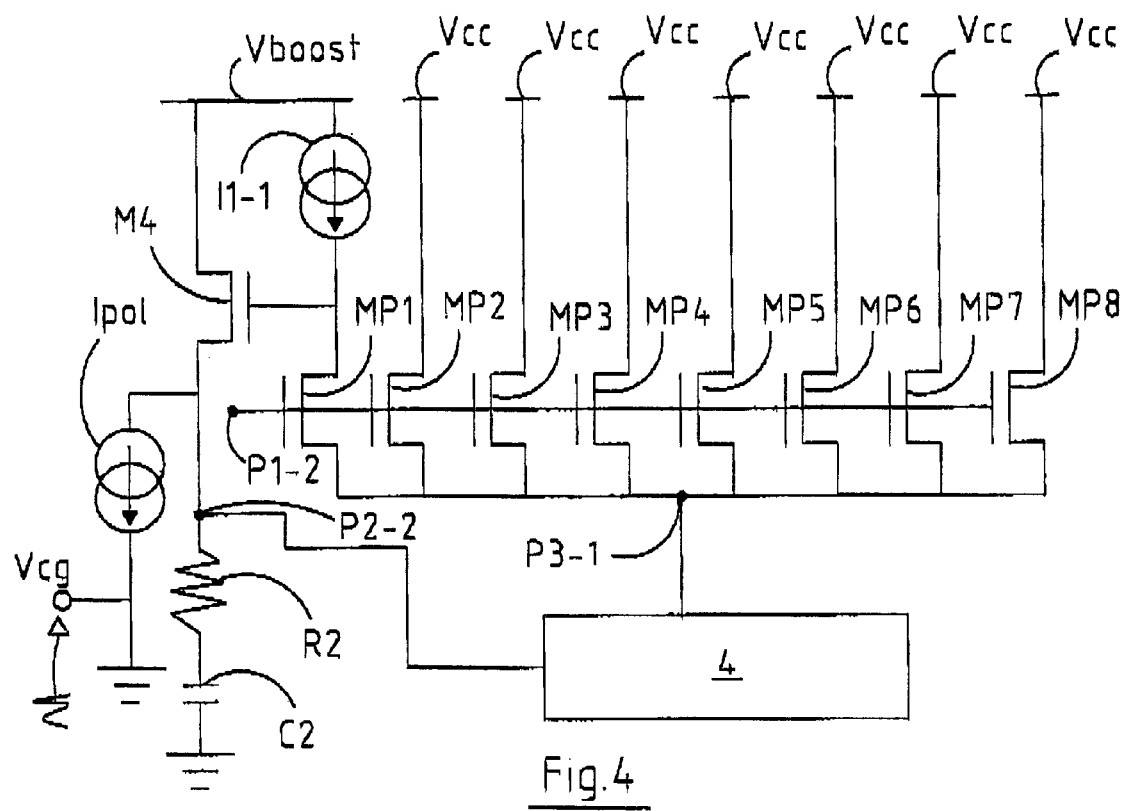
FIG. 4 shows a biasing circuit of the memory cells according to another embodiment of the present invention.

A further embodiment of the present invention therefore allows the same structure to be maintained, but the biasing current of the cells rather than coming from the node of Vboost comes from the supply line Vcc, as shown in FIG. 4.

In FIG. 4, there is shown a biasing circuit of the memory cells in which only the transistor MP1 is biased by the source I1-1, which is supplied by the voltage line Vboost.

All of the other transistors MP2, . . . , MP8, which are technologically identical to MP1, are connected to the supply line Vcc.

Since all of the transistors MP2, . . . , MP8 have the same voltage between the gate and source terminals they also conduct the same current of the source I1-1, which is provided by the supply line Vcc.

However, a single memory cell inside the block 4 is crossed by a current that can be distinct from the current provided by the source I1-1, due to the technological characteristics of each cell being not exactly identical to the other cells, such as threshold voltage and gain, but, the relationship of the currents of the eight cells present in the block 4, must be verified by:

$$(Ic1+Ic2+\ldots+Ic8)=8*I1\text{-}1 \qquad (1)$$

and being powerful for a generic cell the relation current-voltage:

$$Ic_i=K_i*[(Vgs-Vt_i)*Vd+Vd^2/2] \qquad (2)$$

and in view of the fact that the single cells have the drain terminal short circuited, on all the cells globally there is, by extrapolating the relationship (1) for an average current I1 equal to:

$$I1=(Ic1+Ic2+\ldots+Ic8)/8=I1\text{-}1 \qquad (3)$$

so that the voltage on the ends Vcg of the capacitor C2 of the block 2 of FIG. 2 is provided in a way that the forced current by Mcg is equal to the average of the currents of the single cells.

The present invention therefore allows a reading voltage to be provided as a function of the average of the technological characteristics of a reduced population of virgin cells implementing the reading voltage with a remarkable energy savings.

Moreover the consumption of the circuit shown in FIG. 4 as well as maintaining a same total biasing current value has a lower consumption because the supply voltage is reduced, by way of the illustrated example, of seven on eight cells from Vboost to Vcc.

Moreover, thanks to the control gate voltage source by applying on the drain terminal of the virgin cell, taken as reference, there is the same biasing voltage, of about Vd=800 mV, used for biasing the EEPROM cells in reading operations and so forcing on the drain terminal of the same cell a constant well defined current.

Figure 5:
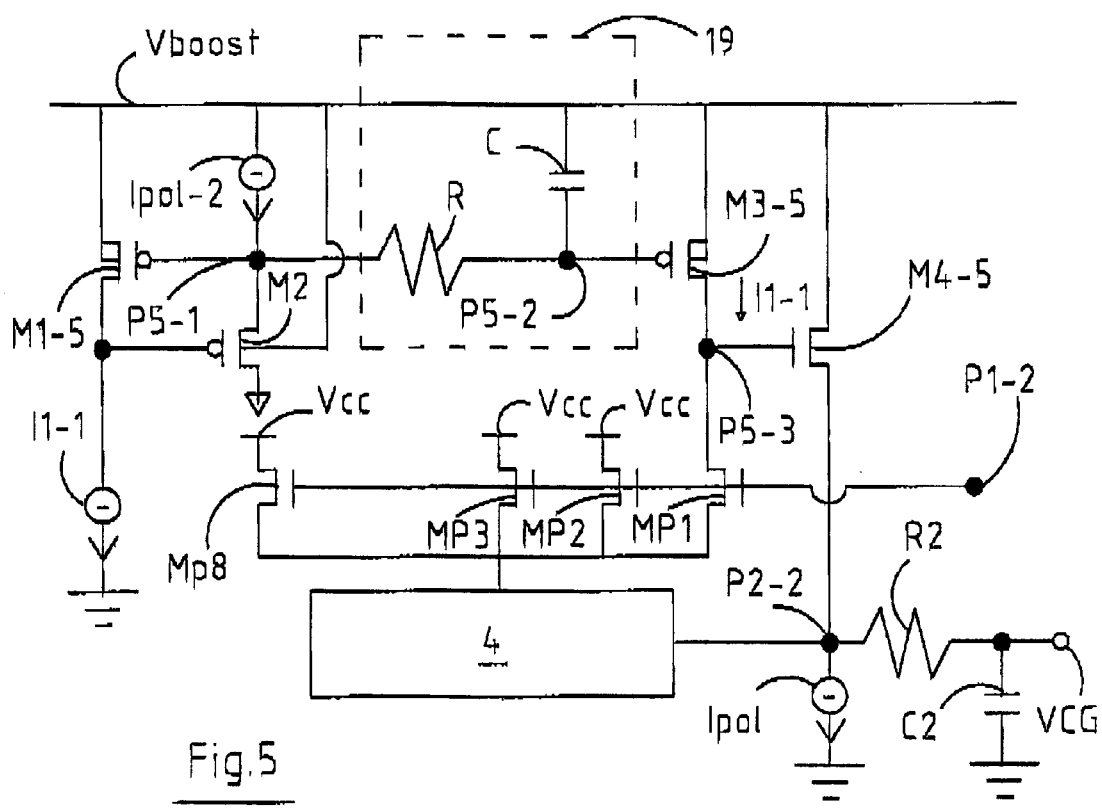
FIG. 5 shows a filtering circuit according to a further embodiment of the present invention.

In FIG. 5, a further embodiment of the present invention wherein it is to be noted a filtering circuit 10, the object of which is providing the current I1-1 of the block 2 of FIG. 2, and filtering at the same time the noise coming from the supply line Vboost, with the latter being provided by a booster.

The block 10 comprises a capacitor C having from a side an electrode connected to the supply Vboost and at the other side a resistance R in turn connected in the node P5-1.

The block 10 is a filtering system comprising the capacitor C, adapted to filter the ripple on the line Vboost, the resistance R, adapted to aid at the instant of the turning on a charge controlled by the capacitor C.

Moreover it is possible to note a transistor M1-5, of p type, and a transistor M2-5, of p type, biased by a source Ipol-2, of low value, adapted to implement a negative feedback on the mirror configuration so as to cause a fast precharge of the node P5-1. The biasing current I1-1 is then mirrored by means of a p type transistor M3-5, having its gate terminal connected in a node P5-2.

The output stage is constituted by a transistor M4-5, of n type, connected in source follower configuration so as to provide to the load (not shown) all of the required current for the dynamic charge of the control gate of the memory cell.

Moreover, to decrease the ripple on the node Vcg a capacitor C2 in series with the resistance R2 is inserted. The capacitor C2 has the function of filtering the noise on the node Vcg, whilst the resistance R2 allows to charge with a controlled speed, the node Vcg during the turning on of the circuit.

The biasing source Ipol, having a low value, serves to discharge quickly the node P2-2 in the case of some overshoots.

In this way the output voltage Vcg of the circuit according to the present invention is independent from the voltage which is supplied the memory because I1-1 and I1-2 are independent from Vcc.

In fact for the latter characteristic, the structure of FIG. 2 obtains the biasing current I1-1 by mirroring the current of a source (not shown) stable to the changing of the supply voltage Vcc and the temperature. The principle on which the source is based is well known and it is to combine two currents, one having a positive thermal gradient and the other with a negative thermal gradient, so as the resulting current is compensated in temperature.

Moreover, the output voltage Vcg of the circuit according to the present invention has a driving capability of successive stages of about a hundred microampere, and it has a state working time lower than five hundred nsec, and it is adjustable because it is possible to change the biasing currents I1-1.

Figure 6:
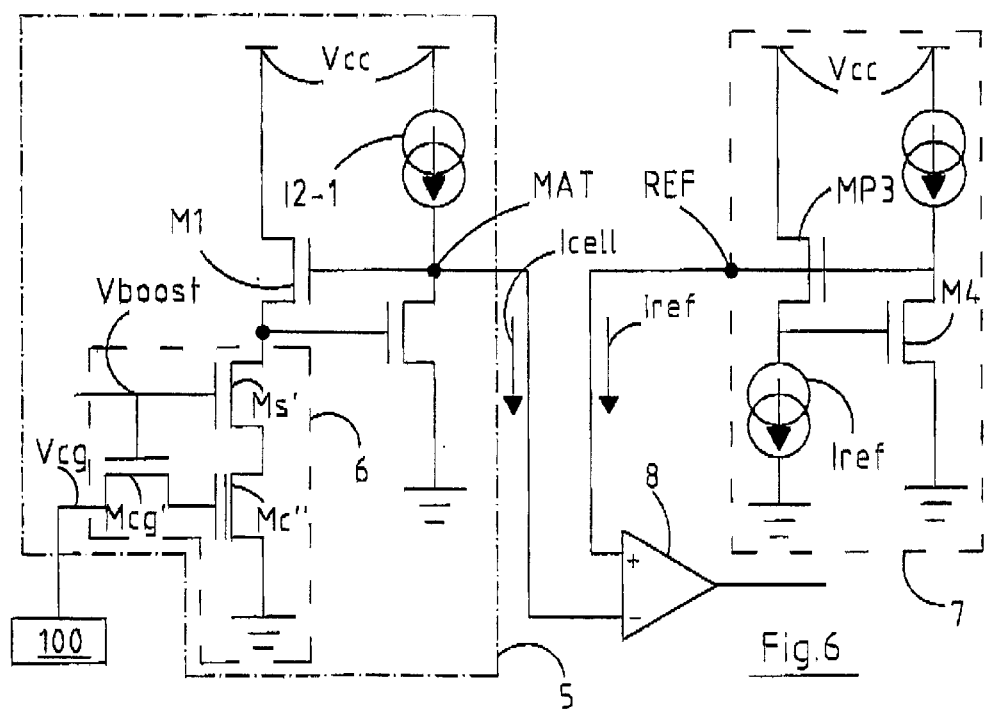
FIG. 6 shows an exemplary application of the present invention.

In FIG. 6, an exemplary application of the present invention is shown, wherein it is possible to note a sense amplifier 8 that receives a reference current Iref from a block 7 and a cell current Icell from a block 5, at which the control gate voltage source 100 is connected.

As it is possible to note the block 5 has the same configuration of the block 1 of FIG. 2, except the source I1-1 is substituted by the block 6, adapted to represent a memory cell to be read.

The block 6 comprises a selection transistor Ms', a transistor Mc' representing a memory cell, and a control transistor Mcg'.

The transistor Ms' is connected to the supply Vcc by means of the transistor M1 and to the ground by means of the transistor Mc'. The gate terminal of Ms' is connected to the gate terminal Mcg', and the gate terminal of Mc' is connected to the source of Mcg'.

The transistor Mcg' is connected with the control gate voltage source, from which it receives the control gate voltage value Vcg that is to be forced to perform the reading operation of the memory cell Mc'.

The block 7 has the structure equal to the block 1 of FIG. 2, a part of the source I1-1, here substituted by a current source Iref, of constant value. The block 7 acts as reference value for the current present in the memory cell when the latter is submitted to a reading operation.

The amplifier 8, which acts as a comparator, has the negative input terminal connected in a node MAT, which is the gate terminal of the transistor M1, from which it receives the current Icell, and the positive input terminal is connected in a node REF, which is the gate terminal of transistor MP3, from which it receives the current Iref.

By performing a reading operation, that is entering to the cell Mc', the circuit contained in the block 5 forces always Vd=800 mV on the drain terminal of the cell Mc'. In this way it is possible in case of a cell having on its own gate terminal a voltage Vcg able to conduct a current higher than the reference current Iref, indicates that the cell is programmed, otherwise, in the case of it conducting a current lower that Iref indicates that it is erased.

Figure 7:
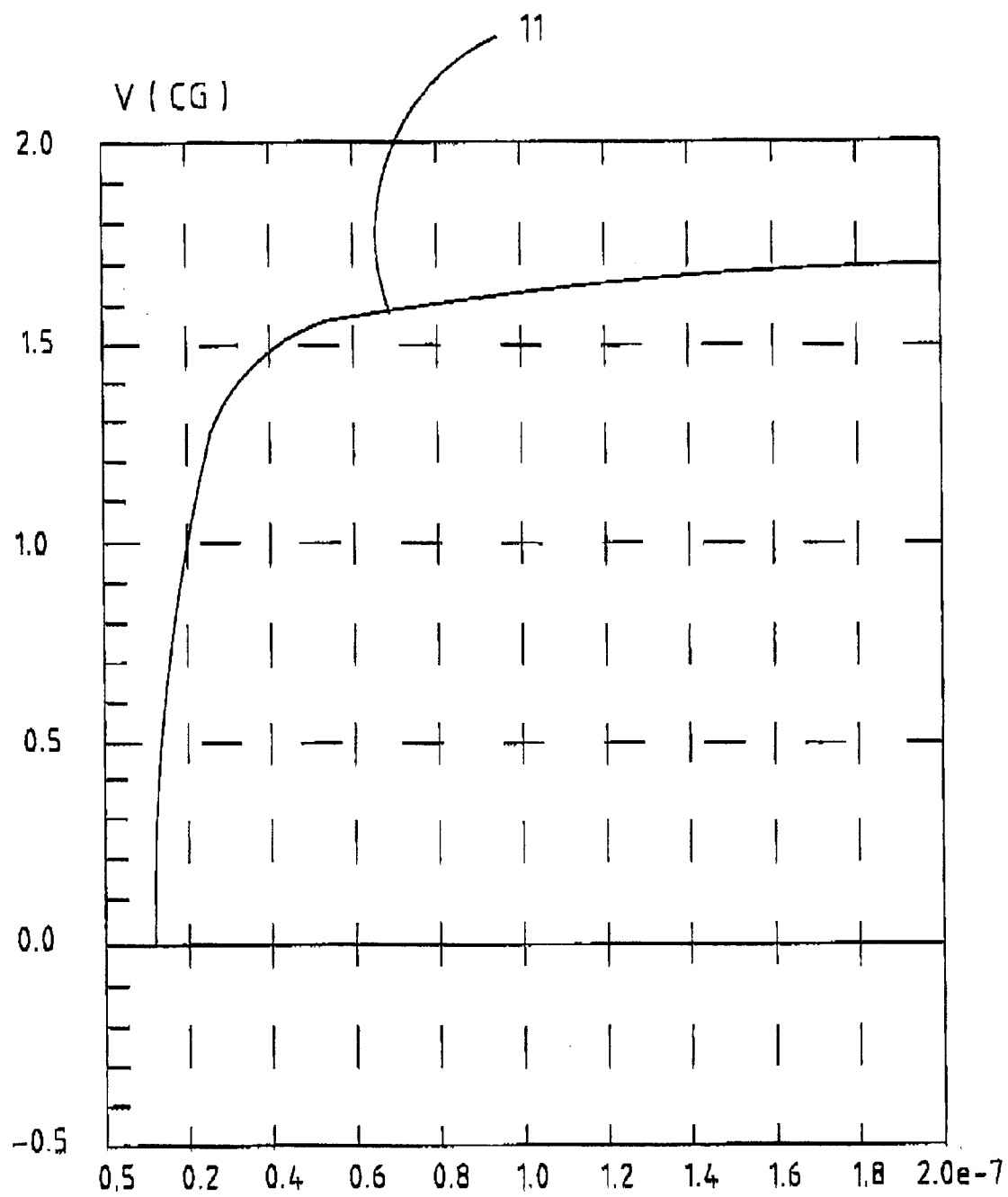
FIG. 7 shows a first simulation of the circuit of FIG. 6.

In FIG. 7, a first simulation of the circuit of FIG. 6 is shown.

It is possible to note an abscissa axis showing the time and an ordinate axis showing the voltage Vcg.

In typical working conditions, by way of example Vcc= 2.6V, T=27° C., and typical types of transistors, there is a trend 11 of the voltage Vcg, at the instant of the turning on, so that the output of the circuit of FIG. 4 makes use of about 140 nsec to reach the state voltage value.

Figure 8:
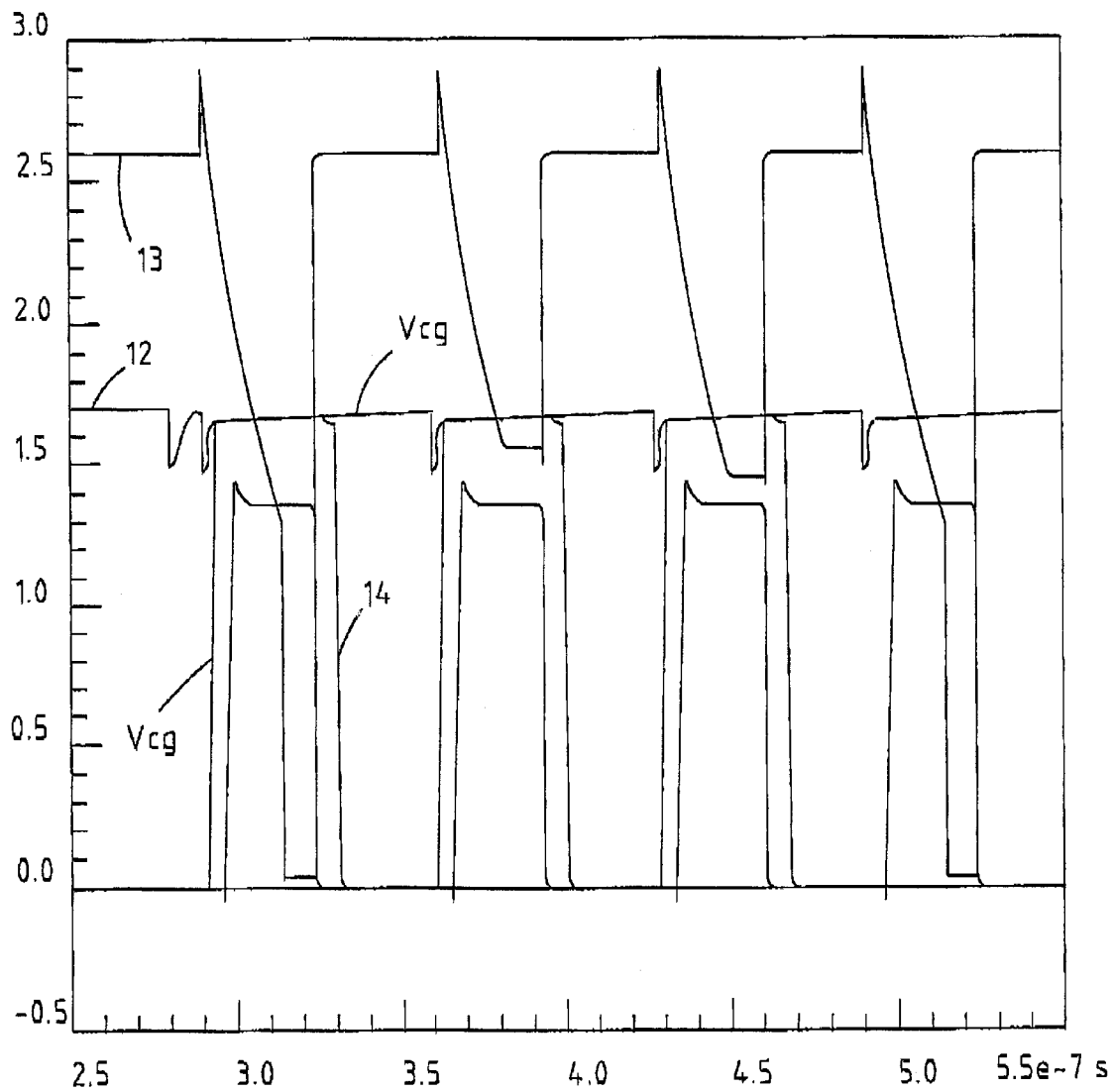
FIG. 8 shows a second simulation of the circuit of FIG. 6.

In FIG. 8, a second simulation of the circuit of FIG. 6 is shown.

It is to be noted an abscissa axis showing the time and an ordinate axis showing the voltage Vcg, the voltage at the node MAT, the voltage at the node REF, and the voltage on the transistor Mcg.

As shown, there is the trend of the voltage Vcg when, after reaching the state value, some reading operations are performed. In fact, it is also to be noted a first trend 12 of the voltage of the node MAT and a second trend 13 of the voltage of the node REF.

It is also to be noted the voltage 14 present on the transistor Mcg, that comes directly from the gate terminal of the activated memory cell. The trend of the voltage 14 grows rapidly until the voltage Vcg before the reading operation starts to discharge to ground at the end of the reading operation.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A reading circuit for reading a memory cell, said reading circuit comprising:
    a reference current source for supplying a reference current;
    a memory cell having first, second, and third terminals, the memory cell being biased between the first and second terminals at a predetermined voltage;
    comparison means for comparing a current flowing in the memory cell with the reference current; and
    a control gate voltage source coupled to the third terminal of the memory cell,
    wherein the control gate voltage source includes a virgin memory cell having fourth, fifth, and sixth terminals,
    the virgin memory cell is biased between the fourth and fifth terminals with a voltage of equal value to the biasing voltage of the memory cell, and
    the control gate voltage source produces a control gate voltage at the sixth terminal of the virgin memory cell.

2. The reading circuit according to claim 1, wherein the control gate voltage source includes an output stage for dynamically applying the control gate voltage to the third terminal to the memory cell.

3. The reading circuit according to claim 1,
    wherein the control gate voltage source (100) includes a generation stage for generating the predetermined voltage,
    the generation stage includes current source means and biasing means for the virgin memory cell, and
    the biasing means for the virgin memory cell is biased by the current source means so as to establish the biasing voltage value to the sixth terminal of the virgin memory cell.

4. The reading circuit according to claim 1, wherein the control gate voltage source includes a plurality of virgin memory cells that have in common the fourth terminal, each of the virgin memory cells being biased by one of a plurality of biasing means that are each supplied by a current means.

5. The reading circuit according to claim 1, wherein the control gate voltage source includes a plurality of virgin memory cells that have in common the fourth terminal, at least one of the virgin memory cells being biased by biasing means and by current means connected to a first supply line, at least one of the other virgin memory cells being biased by biasing means and by current means connected to a second supply line, which has a lower voltage value than the first supply line.

6. The reading circuit according to claim 1, wherein the virgin memory cell includes a virgin memory cell, a selection means for selecting the fourth terminal, and a control means for controlling the sixth terminal.

7. The reading circuit according to claim 4, wherein the plurality of virgin memory cells includes a plurality of virgin memory cells, selecting means for selecting which of the virgin cells is to be read, and a plurality of control means of the virgin cells.

8. The reading circuit according to claim 5, wherein the voltage provided by the first supply line is filtered by a first filtering stage that includes a first capacitor means in series with resistive means.

9. The reading circuit according to claim 8, wherein the voltage provided by the second supply line is filtered by a second filtering stage that includes a second capacitor means.

10. The reading circuit according to claim 6, wherein the biasing means, the plurality of selection means, and the control means are MOSFET transistors.

11. The reading circuit according to claim 1, wherein the memory cell and the virgin memory cell are EEPROM cells.

12. An information processing system that includes at least one memory device, the memory device including a reading circuit for reading a memory cell, said reading circuit comprising:
    a reference current source for supplying a reference current;
    a memory cell having first, second, and third terminals, the memory cell being biased between the first and second terminals at a predetermined voltage;
    comparison means for comparing a current flowing in the memory cell with the reference current; and
    a control gate voltage source coupled to the third terminal of the memory cell,
    wherein the control gate voltage source includes a virgin memory cell having fourth, fifth, and sixth terminals,
    the virgin memory cell is biased between the fourth and fifth terminals with a voltage of equal value to the biasing voltage of the memory cell, and
    the control gate voltage source produces a control gate voltage at the sixth terminal of the virgin memory cell.

13. The information processing system according to claim 12, wherein the control gate voltage source includes an output stage for dynamically applying the control gate voltage to the third terminal to the memory cell.

14. The information processing system according to claim 12,
   wherein the control gate voltage source (100) includes a generation stage for generating the predetermined voltage,
   the generation stage includes current source means and biasing means for the virgin memory cell, and
   the biasing means for the virgin memory cell is biased by the current source means so as to establish the biasing voltage value to the sixth terminal of the virgin memory cell.

15. The information processing system according to claim 12, wherein the control gate voltage source includes a plurality of virgin memory cells that have in common the fourth terminal, each of the virgin memory cells being biased by one of a plurality of biasing means that are each supplied by a current means.

16. The information processing system according to claim 12, wherein the control gate voltage source includes a plurality of virgin memory cells that have in common the fourth terminal, at least one of the virgin memory cells being biased by biasing means and by current means connected to a first supply line, at least one of the other virgin memory cells being biased by biasing means and by current means connected to a second supply line, which has a lower voltage value than the first supply line.

17. The information processing system according to claim 12, wherein the virgin memory cell includes a virgin memory cell, a selection means for selecting the fourth terminal, and a control means for controlling the sixth terminal.

18. The information processing system according to claim 15, wherein the plurality of virgin memory cells includes a plurality of virgin memory cells, selecting means for selecting which of the virgin cells is to be read, and a plurality of control means of the virgin cells.

19. The information processing system according to claim 16, wherein the voltage provided by the first supply line is filtered by a first filtering stage that includes a first capacitor means in series with resistive means.

20. The information processing system according to claim 19, wherein the voltage provided by the second supply line is filtered by a second filtering stage that includes a second capacitor means.

21. The information processing system according to claim 12, wherein the memory cell and the virgin memory cell are EEPROM cells.

* * * * *